(12) United States Patent
Curewitz et al.

(10) Patent No.: US 12,372,575 B2
(45) Date of Patent: *Jul. 29, 2025

(54) MULTI-MODAL MEMORY APPARATUSES AND SYSTEMS

(71) Applicant: MICRON TECHNOLOGY, INC., Boise, ID (US)

(72) Inventors: Kenneth M. Curewitz, Plymouth, MA (US); Jaime Cummins, Bainbridge Island, WA (US); John D. Porter, Boise, ID (US); Bryce D. Cook, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/772,690

(22) Filed: Jul. 15, 2024

(65) Prior Publication Data

US 2024/0369632 A1 Nov. 7, 2024

Related U.S. Application Data

(63) Continuation of application No. 18/047,386, filed on Oct. 18, 2022, now Pat. No. 12,072,381.

(51) Int. Cl.
*G01R 31/28* (2006.01)
*G01R 31/3185* (2006.01)
*G01R 31/319* (2006.01)

(52) U.S. Cl.
CPC ........... *G01R 31/31907* (2013.01); *G01R 31/318594* (2013.01); *G01R 31/318597* (2013.01)

(58) Field of Classification Search
CPC ...... G01R 31/31907; G01R 31/318594; G01R 31/318597
See application file for complete search history.

(56) References Cited

U.S. PATENT DOCUMENTS

| | | | |
|---|---|---|---|
| 5,826,093 A | 10/1998 | Assouad et al. | |
| 7,433,248 B2 | 10/2008 | Choi | |
| 7,539,926 B1 | 5/2009 | Lesea | |
| 9,640,279 B1 * | 5/2017 | Popps | G11C 29/4401 |
| 11,695,539 B1 | 7/2023 | Modi et al. | |
| 12,072,381 B2 * | 8/2024 | Curewitz | G01R 31/318597 |

(Continued)

OTHER PUBLICATIONS

U.S. Appl. No. 18/047,386, filed Oct. 18, 2022, titled, "Multi-Modal Memory Apparatuses and Systems,"; pp. all pages of application as filed.

*Primary Examiner* — Mujtaba M Chaudry
(74) *Attorney, Agent, or Firm* — Dorsey & Whitney LLP

(57) ABSTRACT

A memory controller and a physical interface layer may accommodate multiple memory types. In some examples, the memory controller and/or PHY may include a register that includes operating parameters for multiple operating modes. Different operating modes may be compatible with different memory types. In some examples, the memory controller and physical interface may be included in a system for testing multiple memory types. The system may provide multiple interfaces for communicating with the memory. The different communication types may be used for performing different tests and/or simulating different types of devices that may utilize the memory.

19 Claims, 8 Drawing Sheets

(56) References Cited

U.S. PATENT DOCUMENTS

| | | |
|---|---|---|
| 2006/0161745 A1 | 7/2006 | Lee et al. |
| 2007/0043997 A1 | 2/2007 | Yang et al. |
| 2009/0132742 A1 | 5/2009 | Simmons et al. |
| 2009/0327800 A1 | 12/2009 | Kim |
| 2011/0302341 A1 | 12/2011 | Pione et al. |
| 2011/0302356 A1 | 12/2011 | Helton |
| 2013/0124806 A1 | 5/2013 | Searles et al. |
| 2015/0106668 A1 | 4/2015 | Ran |
| 2016/0117219 A1* | 4/2016 | Halbert ............ G06F 11/076 714/799 |
| 2016/0283320 A1 | 9/2016 | Motwani et al. |
| 2017/0097859 A1 | 4/2017 | Parthasarathy et al. |
| 2018/0285298 A1 | 10/2018 | Lillie et al. |
| 2019/0205244 A1* | 7/2019 | Smith ................ G06F 3/065 |
| 2019/0280411 A1 | 9/2019 | Olarig et al. |
| 2019/0339880 A1 | 11/2019 | Jiang et al. |
| 2024/0125851 A1 | 4/2024 | Curewitz et al. |

* cited by examiner

MULTI-MODAL MEMORY APPARATUSES AND SYSTEMS

CROSS REFERENCE TO RELATED APPLICATION(S)

This application is a continuation of U.S. patent application Ser. No. 18/047,386 filed Oct. 18, 2022 and issued as U.S. Pat. No. 12,072,381 on Aug. 27, 2024. The aforementioned application, and issued patent, is incorporated herein by reference, in its entirety, for any purpose.

BACKGROUND

Semiconductor memories are used in many electronic systems to store data that may be retrieved at a later time. Semiconductor memories are generally controlled by providing the memories with command signals, address signals, and clock signals. The various signals may be provided by a memory controller, for example. The command signals may control the semiconductor memories to perform various memory operations, for example, a read operation to retrieve data from a memory, and a write operation to store data to the memory. As the demand has increased for electronic systems to be faster, have greater computing ability, and consume less power, semiconductor memories that may be accessed faster, store more data, and use less power have been continually developed to meet the changing needs.

Part of the development includes creating new specifications (e.g., standards) for controlling and accessing semiconductor memories, with the changes in the specifications from one generation to the next directed to improving performance of the memories in the electronic systems. In many cases, memories and controllers are developed by different parties, and while specifications may allow significant independent development of memories and controllers, typically, the parties interact at different phases to test one another's products to confirm the memories and controllers interact as expected in compliance with the specification.

In some instances, design differences or performance issues may lead to incompatibility between the memory and the controller. The incompatibility may be due to physical interface issues, performance issues, noncompliance with the specification, and/or other factors. The issues may require design changes by one or both parties, leading to increased development and testing time. Accordingly, tools and techniques for independent performance and compatibility testing may be desirable.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

As disclosed herein, a memory controller and a physical interface layer (PHY) that can accommodate multiple memory types are disclosed. In some embodiments, the memory controller and PHY may be included in a system for testing multiple memory types. The system may provide multiple interfaces for communicating with the memory. The different communication types may be used for performing different tests and/or simulating different types of devices that may utilize the memory. The apparatuses and systems disclosed herein may provide support for multiple memory types and/or more robust memory testing. In some applications, this may allow memory developers to advance farther in the design process prior to testing by controller developers and/or to provide more reliable memories for testing by controller developers. In some applications, this may reduce memory failures, redesigns, and/or total development time.

In some embodiments, the memory controller and/or PHY may be included in a computing system (e.g., mobile device, desktop computer, server, etc.). In some applications, the multi-modal controller and PHY may allow more flexibility in product design.

Figure 1:
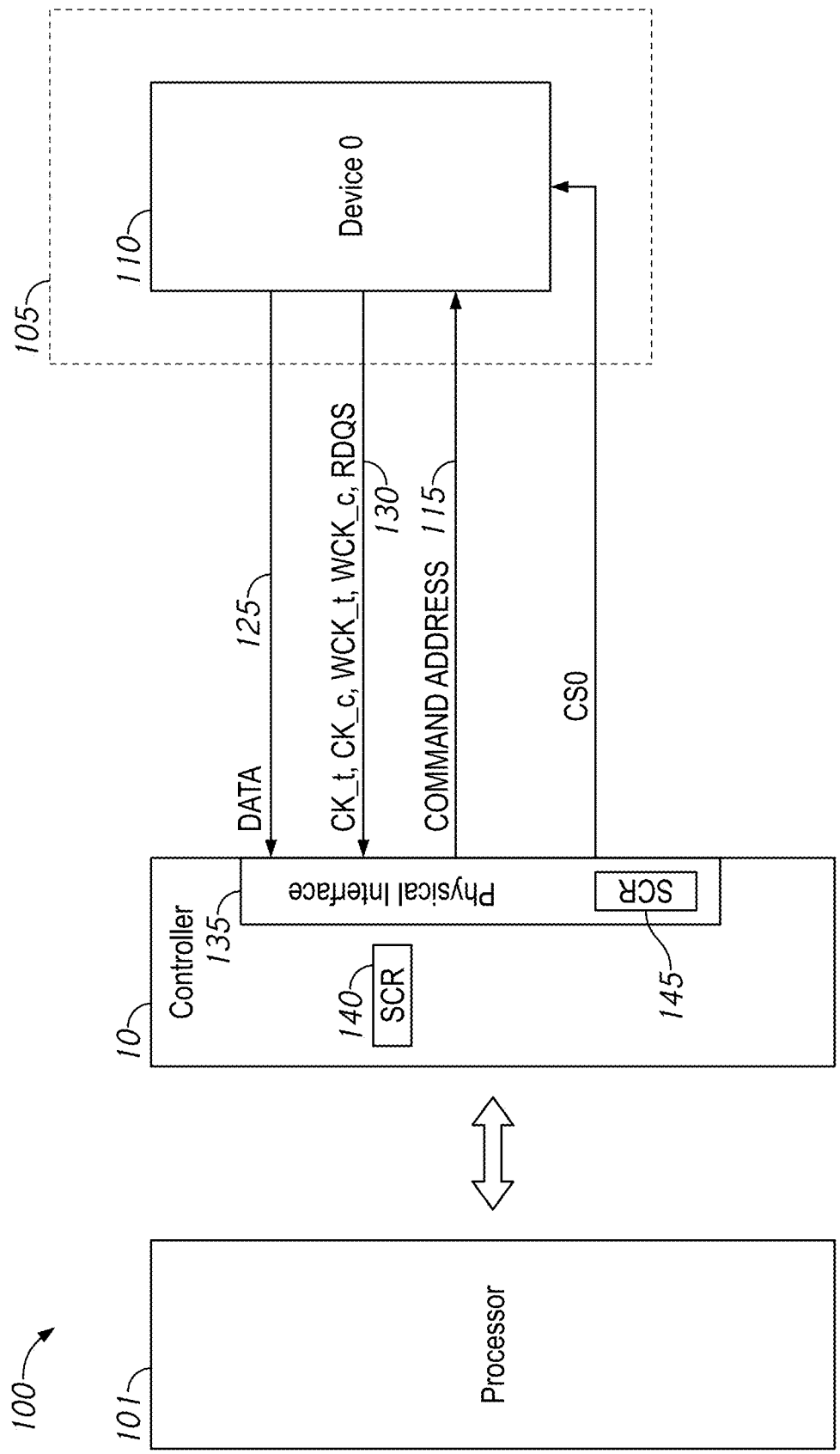
FIG. 1 is a block diagram of a system according to an embodiment of the disclosure.

FIG. 1 is a block diagram of a system 100 according to an embodiment of the disclosure. The system 100 includes a controller 10, a processor 101, and a memory system 105. The system 100 may be included in a computing system which may include a processor 101 that communicates with controller 10 and/or includes controller 10. The memory system 105 includes memory 110. The memory 110 is coupled to the command/address, data, and clock busses. The controller 10 and the memory system 105 are in communication over several communication busses. For example, commands and addresses are received by the memory system 105 on a command/address bus 115, and data is provided between the controller 10 and the memory system 105 over a data bus 125. Various clock signals may be provided between the controller and memory system 105 over a clock bus 130. The clock bus 130 may include signal lines for providing system clock signals CK_t and CK_c from the controller 10 and received by the memory system 105, providing data clock signals WCK_t, and WCK_c from the controller 10 and received by the memory system 105, and providing an access data clock signal RDQS from memory system 105 to the controller 10. In some embodiments, RDQS may include two clock signals: RDQS_t and RDQS_c, similar to the CK and WCK signals. Each of the busses may include one or more signal lines on which signals are provided.

The CK_t and CK_c signals provided by the controller 10 to the memory system 105 are used for timing the provision and receipt of the commands and addresses. In some embodiments, the controller 10 continuously provides active CK_t and CK_c signals when interacting with the memory system 105. The WCK_t and WCK_c signals and the RDQS signal are used for timing the provision of data between the controller 10 and the memory system 105 (e.g., write data from the controller 10 to the memory system 105 and read data from the memory system 105 to the controller 10).

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS0). In embodiments where memory system 105 includes multiple memories 110 (not shown), all memories are provided the commands, addresses, data, and clock signals, the select signals provided on respective select signal lines are used to select which of the memories 110 will respond to the command and perform the corresponding operation. In some embodiments of the disclosure, a respective chip select signal is provided to each memory 110 of the memory system 105. The controller 10 provides an active chip select signal to select the corresponding memory 110. While the respective chip select signal is active, the corresponding memory 100 is selected to receive to the commands and addresses provided on the command and address busses 115 and 120.

In the embodiment shown in FIG. 1, the controller 10 includes an integrated physical interface layer (PHY) 135. However, in other embodiments, the PHY 135 may be a separate component that is coupled between the controller 10 and the memory system 105. In some embodiments, the PHY 135 may include various components, such as circuitry for managing timing requirements of the memory 110. In some embodiments, the PHY 135 may include circuitry for certain training and/or calibration operations, such as ZQ calibration. In some embodiments, the PHY 135 may include hard and soft PHY. The hard PHY may include external terminals (e.g., I/O pads) coupled to the busses and various circuitry such as phase locked loops (PLL), buffers, delay lines, ZQ calibration circuitry, and the like. The soft PHY may include programmable registers, control logic, and the like. In some embodiments, the hard PHY may be coupled between the memory system 105 and the soft PHY and the soft PHY may be coupled between the hard PHY and the controller 10. In some embodiments, the soft PHY may be integrated with the controller 10 and the hard PHY may be a separate component coupled between the soft PHY and the memory system 105.

In some embodiments, the interactions between the controller 10 and the PHY 135 may be specified by a standard, such as DFI 5.0 for example. In some embodiments, the interactions between the controller 10 and/or PHY 135 and the memory 110 and/or memory system 105 may be specified by a standard, such as JEDEC DDR5 or JEDEC LPDDR5, for example.

Typically, a controller and PHY are designed to work with a single type of memory. For example, memories may have different page sizes (e.g., different number of columns), and the controller and PHY may be configured to accommodate receiving data solely from a certain page size. As another example, memories may be based on different storage technologies, which may have different data management operations. For example, low power double data rate dynamic random access memory (LPDDR DRAM), utilizes refresh operations to maintain data integrity of the memory array. However, other memory types (e.g., NAND memory) use other techniques such as scrubbing and relocating data and/or wear leveling. The controller and PHY may only be configured to provide the proper commands and timing of said commands for a particular memory type.

According to embodiments of the present disclosure, the controller 10 may be configured to operate multiple memory types. The multiple memory types may include memories of different sizes, standards (e.g., JEDEC LPDDR5, JEDEC GDDR6) supported, and/or technologies. In some embodiments, the controller 10 may include one or more programmable status and control registers (SCR) 140 that define one or more operating parameters for the controller 10. In some embodiments the PHY 135 may include one or more SCR 145 that define one or more operating parameters for the PHY 135. The SCR 145 may be included in the soft PHY and/or hard PHY.

In some embodiments, the SCR 140, 145 may include operating parameters for use with different memory types. In some embodiments, the controller 10 and/or PHY 135 may read a mode register (e.g., by issuing a mode register read command) of the memory 110 to determine the memory type of memory 110. For example, for certain memory specifications/standards, a mode register of memory 110 may include a fabrication identification (FABID) that may indicate the memory type of the memory 110. In another example, a mode register of the memory 110 may include one or more values that indicate the type of memory 110. Once the memory type is determined (e.g., based on the information received from the mode register of memory 110), the controller 10 and/or PHY 135 may use the operating parameters provided in SCR 140, 145 that correspond to the memory type of memory 110.

In some embodiments, the PHY 135, even if a separate component from the controller 10, may be configured by control signals provided by the controller 10. In these embodiments, SCR 145 of the PHY 135 may be omitted. In some of these embodiments, parameters stored in SCR 140 of the controller 10 may be used to configure the PHY 135.

In some embodiments, the memory type of memory 110 may be known, and SCR 140, 145 may be programmed with the appropriate parameters for the memory type. In these embodiments, the controller 10 and/or PHY 135 may omit determining the memory type of memory 110.

In some applications, having controllers and/or PHY that can handle multiple memory types (e.g., multi-modal), may provide more flexibility for system designers, such as system 100. Designers may select a memory type based on trade-offs between various memory types such as memory capacity, latency, bandwidth, retention, endurance, and cost. Designers may be able to select a memory type that suits the needs of the system 100 without having to select a different PHY 135 and/or controller 10. As will be described herein, a multi-modal controller and PHY may improve the ability to test different memory types in some applications.

Figure 2:
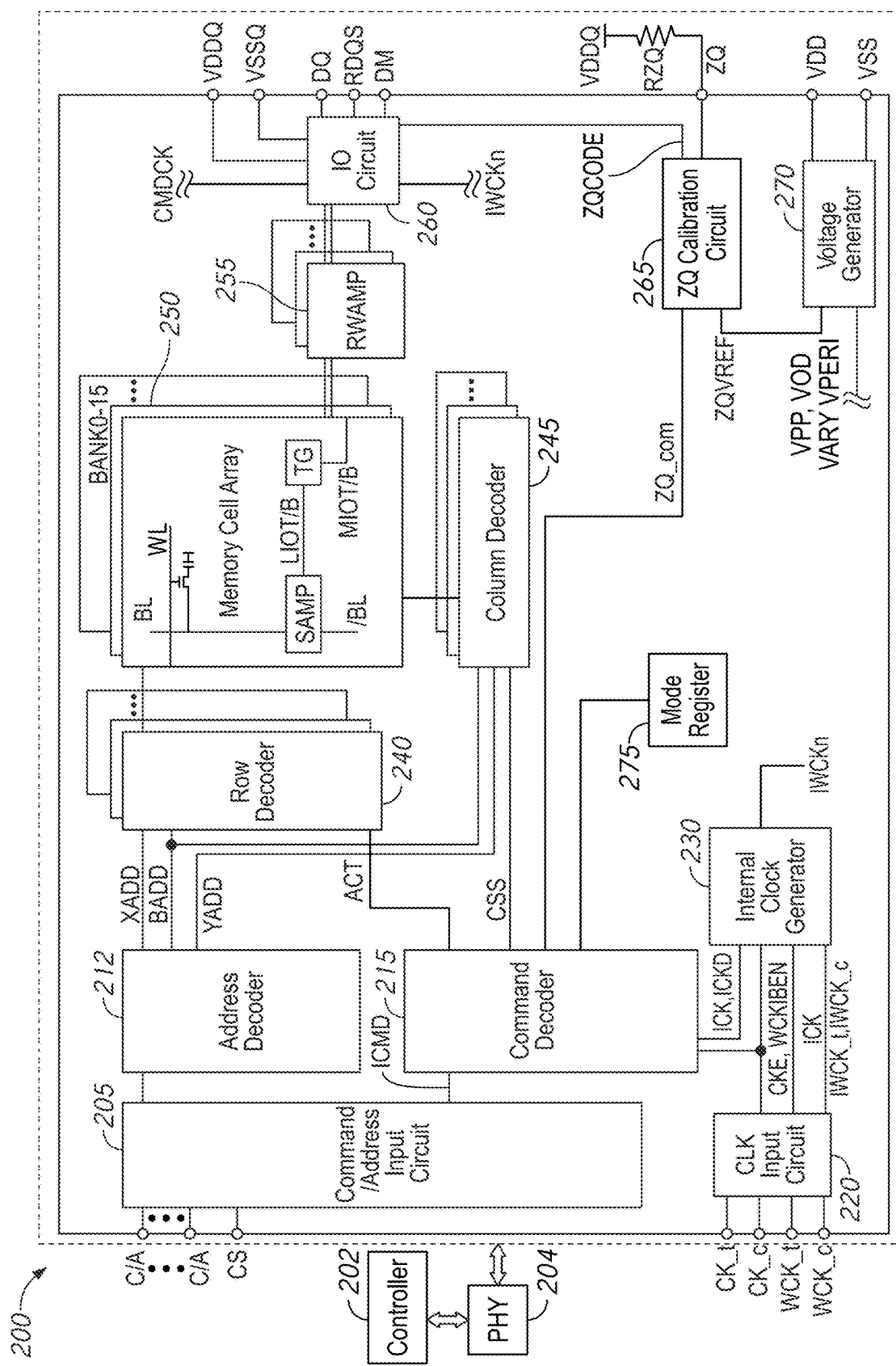
FIG. 2 is a block diagram of an apparatus according to an embodiment of the disclosure.

FIG. 2 is a block diagram of an example apparatus according to an embodiment of the disclosure. The apparatus may be a semiconductor device 200, and will be referred as such. In some embodiments, the semiconductor device 200 may include, without limitation, a dynamic random access (DRAM) device integrated into a single semiconductor chip. In some examples, the DRAM may be a low power double data rate (LPDDR) memory. In some examples, the DRAM may be another memory type such as emerging memory (e.g., NAND, spin-transfer magnetoresistive RAM (MRAM), ferroelectric, spin-orbital torque MRAM, phase change memory, resistive RAM). The semiconductor device 200 may be included in the memory system 105 of FIG. 1 in some embodiments of the disclosure. For example, the memory 110 may include a semiconductor device 200.

The semiconductor device 200 includes a memory die. The die may be mounted on an external substrate, for example, a memory module substrate, a mother board or the like (e.g., package-on-package (POP)). The semiconductor device 200 may further include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals that include command and address terminals coupled to a command/address (C/A) bus to receive command and address signals, clock terminals to receive clock signals CK_t and CK_c, data clock terminals to receive data clock signals WCK_t and WCK_c, data terminals DQ, RDQS, DBI, and DMI, power supply terminals VDD, VSS, VDDQ, and VSSQ, and the ZQ calibration terminal (ZQ).

The C/A terminals may be supplied with an address and a bank address signal from outside, for example, from a controller 202 via a PHY 204 (which may or may not be integrated with the controller 202). The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a memory controller, such as controller 10 of FIG. 1. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line and a column select signal (CSS) to select a bit line. Another example may be providing internal signals to enable circuits for performing operations, such as control signals to enable signal input buffers that receive clock signals. The internal commands also include output and input activation commands.

The command decoder 215 may access mode register 275 that is programmed with information for setting various modes and features of operation for the semiconductor device 200. For example, the mode register 275 may provide parameters that allow the semiconductor device 200 to operate at different frequencies, provide different burst lengths, allow banks BANK0-15 to be organized into different groups, and/or other different operating conditions. In some embodiments, mode register 275 may include multiple registers. For example, the mode register 275 may be programmed with information related to data access latency, such as read latency or write latency. As another example, the mode register 275 may be programmed with information related to data burst length. The data burst length defines a number of data bits provided from or to each of the data terminals DQ per access operation (e.g., read or write operation). The mode register 275 may further be programmed with information regarding the memory type of semiconductor device 200. For example, the mode register 275 may include information that indicates a memory type of semiconductor device 200, such as a number of columns (e.g., page size) of the memory array 250, standards supported, memory technology (e.g., LPDDR, ReRAM), and the like. In some embodiments, the mode register 275 may include a FABID that indicates the memory type. In some embodiments, the FABID may be unique to the semiconductor device 200.

The information in the mode register 275 may be programmed by providing the semiconductor device 200 a mode register write command, which causes the semiconductor device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the semiconductor device 200 accordingly. Information programmed in the mode register 275 may be externally provided by the semiconductor device 200 using a mode register read command, which causes the semiconductor device 200 to access the mode register 275 and provide the programmed information (e.g., to the memory controller 202). In some embodiments, the information may be provided via the C/A terminals and/or the DQ terminals.

In some embodiments, the controller 202 may issue a mode register read command to read information stored in one or more registers of the mode register 275. The mode register read command may read registers storing information related to memory type. In some embodiments, responsive to receiving the memory type information from the mode register 275, the controller 202 and/or PHY 204 may select operating parameters compatible with the memory type indicated by the information in mode register 275. In some embodiments, the controller 202 and/or PHY 204 may store operating parameters in one or more registers (not shown in FIG. 2, see SCR 140 and 145 in FIG. 1).

Thus, similar to semiconductor device 200, the controller 202 and/or PHY 204 are capable of multiple modes of operation. For example, if the information in the mode register 275 indicates semiconductor device 200 includes a phase change memory (PCM), the controller 202 and/or PHY 204 may select operating parameters that allow the controller 202 and/or PHY 204 to operate with timings compatible with the PCM and perform certain operations, such as wear leveling. In contrast, if the information in the mode register 275 indicates semiconductor device 200 includes DDR DRAM, the controller 202 and/or PHY 204 may select operating parameters that allow the controller 202 and/or PHY 204 to operate with timings compatible with DDR DRAM and perform refresh operations.

Turning to the explanation of the external terminals included in the semiconductor device 200, the clock terminals and data clock terminals are supplied with external clock signals and complementary external clock signals. The external clock signals CK_t, CK_c, WCK_t, WCK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215 and an input buffer passes the WCK_t and WCK_c signals when enabled by a WCKIBEN signal from the command decoder 215. The clock input circuit 220 may use the external clock signals passed by the enabled input buffers to generate internal clock signals ICK and IWCK_t and IWCK_c. The internal clock signals ICK and IWCK_t and IWCK_c are supplied to internal clock circuits 230.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. The internal clock circuits 230 may further include a data clock path that receives the IWCK_t and IWCK_c clock and/or ICK and ICKD signals and provides multiphase clock signals IWCKn. As will be described in more detail below, the multiphase clock signals IWCKn have relative phases with each other. The multiphase clock signals IWCKn may also be provided to the input/output circuit 260 for controlling an output timing of read data and the input timing of write data. The input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 260, and thus an impedance of an output buffer (not shown) included in the input/output circuit 260 is specified.

While the example components shown in semiconductor device 200 may be included in a variety of memory types, variations in layout and included components may vary between memory types. For example, not all memory types may include DBI and/or DM terminals and/or may generate different internal timing signals than those shown and described.

Figure 3:
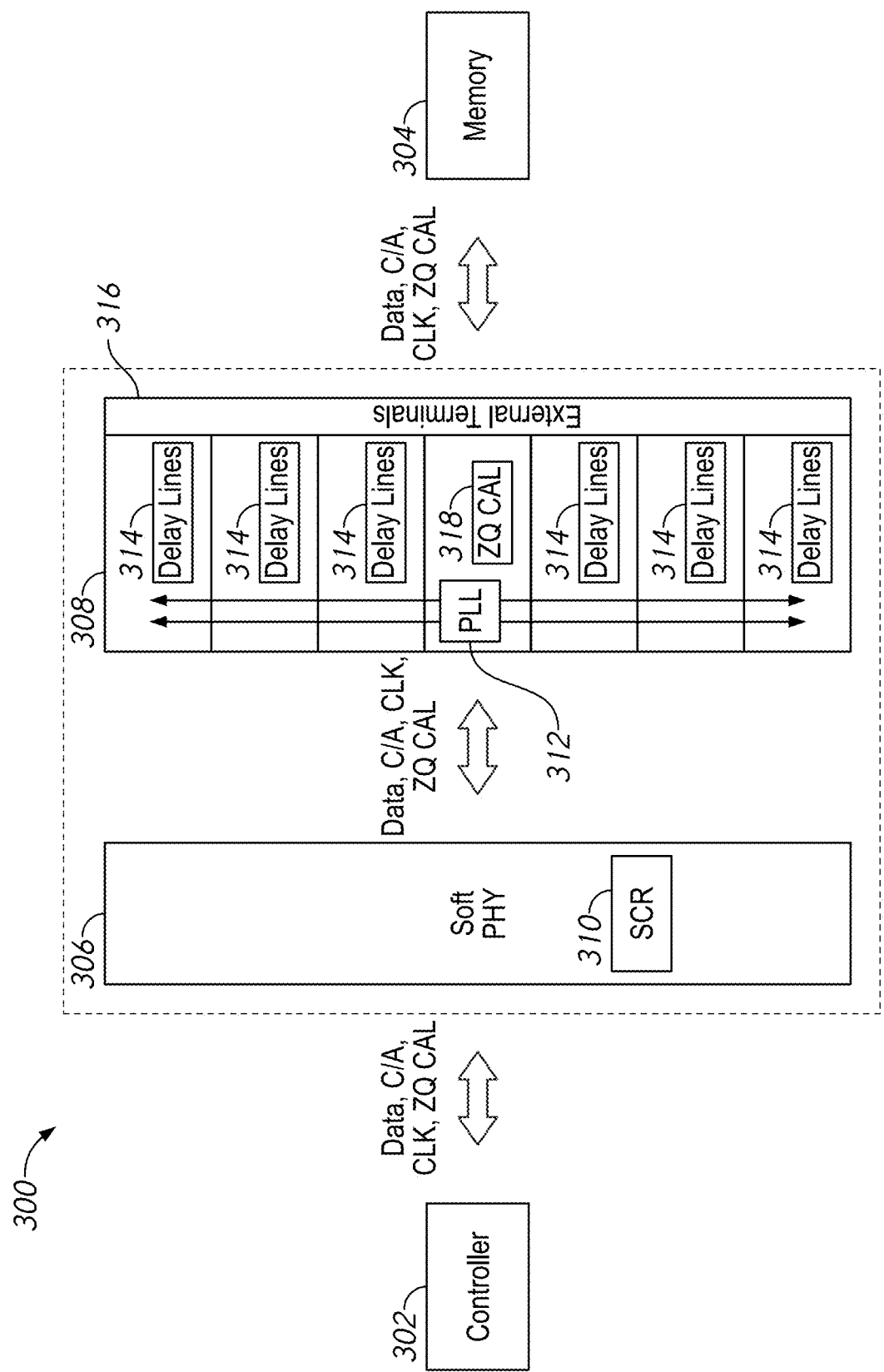
FIG. 3 is a block diagram of a physical interface layer according to an embodiment of the disclosure.

FIG. 3 is a block diagram of a physical interface layer according to an embodiment of the disclosure. In addition to the PHY 300, a controller 302, and a memory device 304 are shown for context. The PHY 300 may be used to implement PHY 204 and/or PHY 135 in some embodiments. In some embodiments, the controller 302 may be used to implement controller 202 and/or controller 10 in some embodiments. In some embodiments, the memory device 304 may be used to implement memory 110 and/or semiconductor device 200.

The PHY 300 may act as an interface between the controller 302 and the memory device 304. In some embodiments, the PHY 300 may manage timing requirements of the memory device 304 and/or other requirements. In some embodiments, interactions between the PHY 300 and the controller 302 may be specified by one or more standards (e.g., DFI 5.0). The PHY 300 may transmit commands, addresses, clock signals, data, and the like from the controller 302 to the memory device 304. The PHY 300 may transmit clock signals, data, and the like from the memory device 304 to the controller 302. In some examples, such as the one shown in FIG. 3, the PHY 300 may transmit and/or receive ZQ calibration information between the controller 302 and memory device 304. In some embodiments, such as the one shown in FIG. 3, the PHY 300 may include a soft PHY 306 and a hard PHY 308.

The soft PHY 306 may be coupled to the controller 302 and the hard PHY 308. The soft PHY 306 may include one or more registers, such as status and control register (SCR) 310. In some embodiments, the soft PHY 306 may be controlled, at least in part, by the controller 302. In some embodiments, the SCR 310 may be programmable, such as by controller 302 and/or another component (e.g., a processor, such as processor 101). The SCR 310 may store multiple values. The values may be associated with various operating parameters of the PHY 300. In some embodiments, the SCR 310 may include values associated with operating parameters for different modes of operation of the PHY 300. For examples, different values may provide timing requirements associated with different operating modes. In some embodiments, the values in the SCR 310 that are selected as the operating parameters used by the PHY 300 may be based, at least in part, on a memory type of memory device 304.

The hard PHY 308 may be coupled to the soft PHY 306 and the memory device 304. In some embodiments, the hard PHY 308 may be coupled to the memory device 304 by one or more external terminals 316. In some embodiments, the external terminals 316 may be coupled to external terminals of the memory device 304 (e.g., C/A and CS terminals shown in FIG. 2). In some embodiments, the hard PHY 308 may include components that manage timing requirements of the memory device 304 and/or controller 302. In the example shown in FIG. 3, the hard PHY 308 includes a phase locked loop 312 (PLL) and delay lines 314. The hard PHY 308 includes a ZQ calibration circuit 318 (ZQ CAL).

The ZQ calibration circuit 318 may perform and/or facilitate performance of ZQ calibration of the memory device 304. In some embodiments, the hard PHY 308 may be controlled, at least in part, by the soft PHY 306 and/or controller 302. For example, certain timing parameters implemented by the phase locked loop 312 and/or delay lines 314 may be based, at least in part, on values of operating parameters selected from the SCR 310 of the soft PHY 306.

Figure 4:
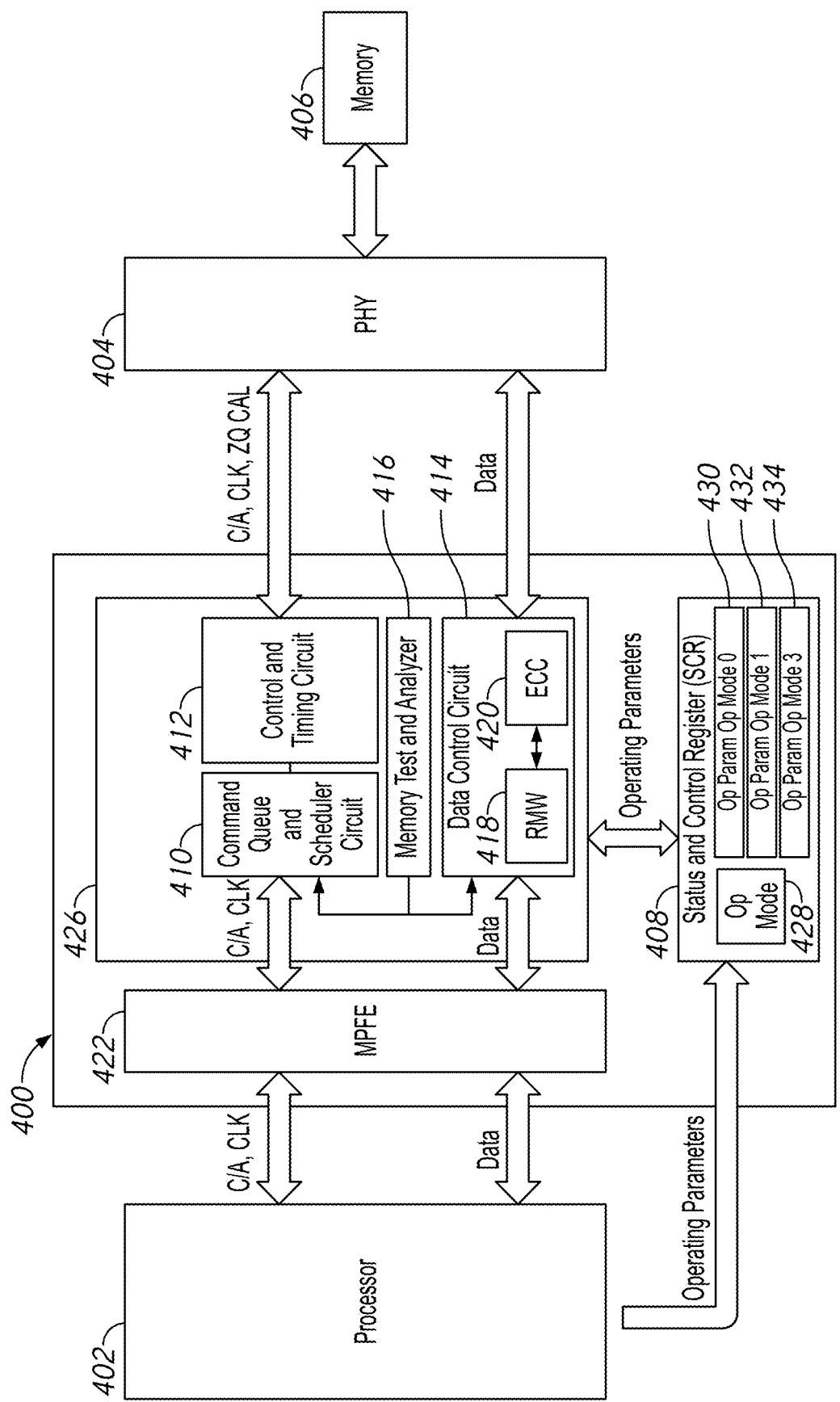
FIG. 4 is a block diagram of a controller according to an embodiment of the disclosure.

FIG. 4 is a block diagram of a controller according to an embodiment of the disclosure. In addition to the controller 400, a processor 402, a PHY 404, and a memory device 406 are shown for context. In some embodiments, the controller 400 may be used to implement controller 302, controller 202 and/or controller 10 in some embodiments. The processor 402 may be used to implement processor 101 in some embodiments. The PHY 404 may be used to implement PHY 300, PHY 204 and/or PHY 135 in some embodiments. In some embodiments, the memory device 406 may be used to implement memory device 304, memory device 110 and/or semiconductor device 200.

The controller 400 may be coupled to the processor 402 and PHY 404. The controller 400 may communicate with the memory device 406 via the PHY 404 in some embodiments. The controller 400 may transmit and receive command, address, data, clock signals, and/or ZQ calibration information with the PHY 404. The controller 400 may transmit and receive command, address data, and/or clock signals with the processor 402. In some embodiments, such as the one shown in FIG. 5, the various signals may be transmitted to and from a multiport front end (MPFE) circuit 422.

The controller 400 may include a command queue and scheduler circuit 410. The command queue and scheduler circuit 410 may receive commands from the processor 402, and may order and generate commands for the memory device 406 responsive to the commands from the processor 402. The controller 400 may include a control and timing circuit 412. The control and timing circuit 412 may control the timing of when commands, addresses, clock signals, and/or addition information is transmitted from the controller 400. The controller 400 may include a data control circuit 414. The data control circuit 414 may control transmission of data from the processor 402 to the memory device 406 (via the PHY 404) and transmission of data from the memory device 406 (via the PHY 404) to the processor 402.

In some embodiments, the data control circuit 414 may include a read-modify-write (RMW) circuit 418 for performing RMW operations. In some embodiments, the data control circuit 414 includes error correction code (ECC) circuit 420. In some applications, by providing the ECC circuit 420 in the controller 400, error correction may occur at the application layer rather than at the memory layer.

In some embodiments, the controller 400 may include a memory test and analyzer circuit 416. This may allow the controller 400 to perform one or more on-controller tests of memory device 406 and analyze the results of the test.

In some embodiments, the controller 400 may include one or more registers, such as status and control register (SCR) 408. In some embodiments, the controller 400 may be controlled, at least in part, by the processor 402. In some embodiments, the SCR 408 may be programmable, such as by processor 402 and/or another component (e.g., a separate processor or controller included in a computing system with the controller 400). The SCR 408 may store multiple values. The values may be associated with various operating parameters of the controller 400. In some embodiments, the SCR 408 may include values associated with operating parameters for different modes of operation of the controller 400.

For examples, different values may provide timing requirements and/or command types associated with different operating modes. In some embodiments, the values in the SCR 408 that are selected as the operating parameters used by the controller 400 may be based, at least in part, on a memory type of memory device 406.

In some embodiments, the controller 400 may transmit a mode register read command to the memory device 406. In response, the memory device 406 may provide a value, such as a FABID, or multiple values, that indicate a memory type of the memory device 406. Based, at least in part, on the value received from the memory device 406, the controller 400 may select the appropriate operating parameters from the SCR 408 for a mode of operation (e.g., operating mode) that is appropriate for the memory type of memory device 406. In some embodiments, the controller 400 may provide a control signal to the PHY 404 to cause the PHY 404 to select appropriate parameters from an SCR (e.g., SCR 310) of the PHY 404. However, in other embodiments, the PHY 404 may automatically select the appropriate parameters responsive to the value received by the memory device 406. In some embodiments, little or no changes to the PHY 404 are required, and only operations of the controller 400 are adjusted based on the memory type.

In some embodiments, such as when the memory type of memory device 406 is known in advanced, the SCR 408 may be programmed with the appropriate values for the operating parameters for a desired operating mode (e.g., by processor 402), and the controller 400 does not issue a mode register read command to determine the memory type of memory device 406.

FIG. 4 illustrates an example arrangement of the SCR 408. The arrangement shown is merely for exemplary purposes, and other arrangements may be used in other embodiments. In the example provided, SCR 408 includes an operating mode register 428 and multiple operating parameter registers 430, 432, and 434. The operating mode register 428 may store a value that indicates which operating mode the controller 400 should operate. The operating parameter registers 430, 432, and 434 may each store one or more values for one or more parameters for a given operating mode. The operating parameter registers 430, 432, and 434 may have been preset during fabrication of the controller 400, programmed by the processor 402, and/or another device. Based on the value stored in the operating mode register 428, the controller 400 may use the operating parameters stored in the appropriate operating parameter register 420, 432 or 434. For example, if a value of 1 is written to the operating mode register 428, the controller 400 may use the values for the operating parameters stored in operating parameter register 432. In some embodiments, the operating mode register 428 may be written with a value responsive to the result of the mode register read command. In some embodiments, the operating mode register 428 may be written to by the processor 402. This arrangement of the SCR 408 and technique for selecting the operating parameters for controller 400 is provided merely as an example and different arrangements and techniques may be used in other embodiments. For example, in some embodiments, the operating mode register 428 may be omitted, and the appropriate operating parameters are selected based on a control signal. In some embodiments, the SCR 408 may include a single operating parameter register which is programmed by the processor 402 or another device. In some embodiments, the SCR register of the PHY (e.g., SCR 310, 145) may have the same or similar arrangement to the SCR register 408.

In some embodiments, the controller 400 may be a multi-channel controller. In these embodiments, some or all of the components included in box 426 may represent the components of one channel of controller 400, and controller 400 may include multiple channels (e.g., multiple boxes 426). For example, controller 400 may include a command queue and scheduler circuit 410, a control and timing circuit 412, and a data control circuit 414 for each channel. In some embodiments, each channel may include a memory test and analyzer circuit 416. In some embodiments, all channels of the controller 400 may share an MPFE 422 and SCR 408. However, in other embodiments, each channel may have separate MPFE 422 and SCR 408.

In some applications, the multi-modal controllers and PHY described herein may provide more flexibility for system designers. Designers may be able to select a memory type that suits the needs of the system without having to select a different PHY and/or controller. For example, a system designer may select "traditional" DRAM for a high-performance computing system product, and NAND memory for a mobile device product without changing the controller and/or PHY.

Further, a multi-modal controller and PHY may improve the ability to test different memory types and/or test memory devices in a more robust manner. Typically, memory testers perform standardized tests such as reading and writing specific patterns to the memory array and stress-testing the memory array to check for defective memory cells or shorts between word lines. The tests are often performed at clock speeds that are slower than the clock speeds that memory devices are used with controllers and the tests typically do not include providing the memory devices with standard-specified commands that the memory devices will receive from a controller and/or PHY. While the testers may allow many memory devices to be tested in parallel, the testing may not provide information as to whether the memory device will operate properly for a given standard and/or during typical use in a computing system including the memory device. A memory device that otherwise passes tests performed during fabrication and packaging may not perform satisfactorily when included in a computing system. Accordingly, more "realistic" testing of memory devices may be desired. That is, testing of the memory device at clock speeds used in computing systems and with commands the memory device will receive from other components of the computing system (e.g., from a controller).

Figure 5:
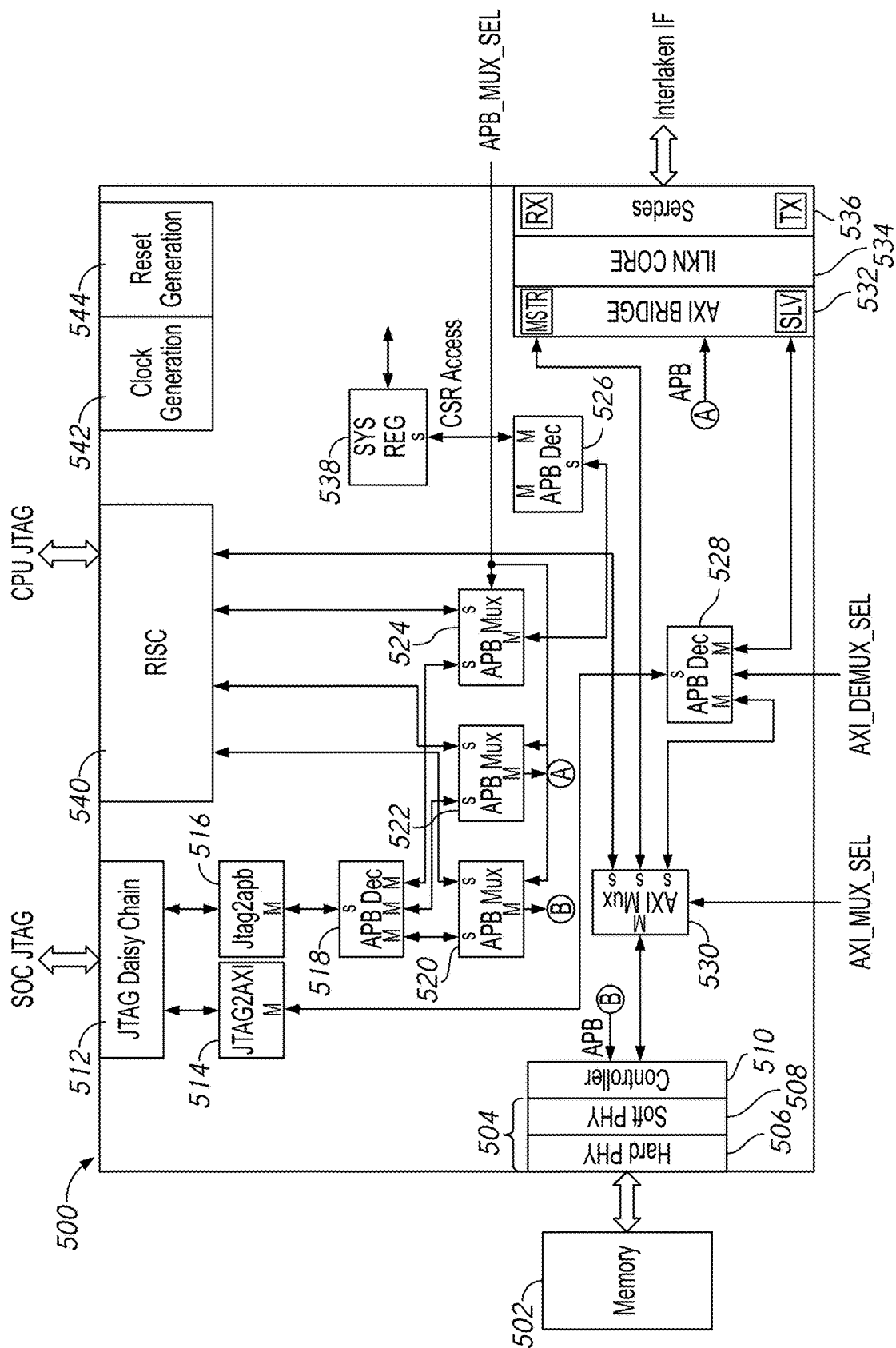
FIG. 5 is a block diagram of a system according to an embodiment of the disclosure.

FIG. 5 is a block diagram of a system according to an embodiment of the disclosure. In some embodiments, system 500 may be a system on a chip (SoC). In addition to system 500, FIG. 5 shows a memory device 502 for context. The memory device 502 may implement memory device 406, 304, 200, and/or 110 in some embodiments. The system 500 may allow for multiple types of tests to be performed on memory device 502.

The system 500 may include a PHY 504 that is coupled to the memory device 502. The PHY 504 may include a hard PHY 506 and a soft PHY 508 in some embodiments. In some embodiments, the PHY 504 may implement PHY 404, PHY 300, PHY 204, and/or PHY 135. The system 500 may include a controller 510 coupled to the PHY 504. In some embodiments, the controller 510 may implement controller 400, controller 302, controller 202, and/or controller 10. The system 500 may include a clock generation circuit 542 and a reset generation circuit 544 for providing clock and reset signals for various components of the system 500. In some embodiments, the clock and reset signals generated by the clock generation circuit 542 and reset generation circuit 544 may be based on signals provided by other computing devices (not shown). The system 500 may include a system register 538 that stores operating parameters and/or other information for the system 500.

The system 500 may provide multiple interfaces for interacting with the memory device 502 via the controller 510 and PHY 504. In the example shown in FIG. 5, the system 500 includes a Joint Test Action Group (JTAG) interface, a reduced instruction set computer (RISC) interface, and a chip-to-chip (C2C) interface. The three interfaces may allow different tests to be performed on the memory device 502. In some examples, the JTAG interface may allow known patterns with known outputs to be provided to the memory device 502. This may allow tests similar to tests performed by existing testers to be performed. In some examples, the RISC interface may allow the memory device 502 to be tested in a manner that simulates use of the memory device 502 in a mobile device (e.g., watch, phone, tablet, medical device). In some examples, the C2C interface may allow the memory device 502 to be connected to an external device in a system environment, which may expose the memory device 502 to the system for read and write traffic. In some applications, this may allow memory device 50 to be tested in a manner that more closely simulates use of the memory device 502 in a work station, server, and/or other high demand computing environments.

For the example JTAG interface, in some embodiments, the system 500 may include a JTAG daisy chain 512. In other embodiments, an interface other than a daisy chain may be used. In some embodiments, the JTAG daisy chain 512 may be coupled to another computing device, such as a JTAG SoC (not shown). The system 500 may include a JTAG advanced extensible interface (AXI) 514 for transmitting data (e.g., write patterns) received via the JTAG daisy chain 512. The data may be provided to an AXI demultiplexer (DeMUX) 528. The system 500 may include a JTAG advanced peripheral bus (APB) 516 for providing commands received via the JTAG daisy chain 512. The commands may be received by an APB decoder 518 for decoding the commands. The decoded commands may be provided to an APB multiplexer (MUX) 520, APB MUX 522, and/or APB MUX 524.

For the example RISC interface, a RISC 540 may be included in system 500 in some embodiments. In some embodiments, the RISC 540 may be coupled to another computing device and/or a central processing unit (CPU) JTAG (not shown). The RISC 540 may provide data AXI MUX 530 and provide commands to APB MUX 520, APB MUX 522, and/or APB MUX 524. While a RISC interface is provided in the example shown in FIG. 5, in other embodiments, other interfaces may be used, such as other microprocessors (e.g., ARM) or a core complex with multiple CPU cores.

For the example C2C interface, system 500 may include an AXI bridge 532, an Interlaken core 534, and a serializer/deserializer (SerDes) circuit 536. The Serdes circuit 536 may be in communication with another chip (not shown). In some embodiments, the AXI bridge 532, Interlaken core 534, and/or SerDes circuit 536 may be implemented as one or more field programmable gate arrays (FPGAs). The AXI bridge 532 may provide an interface between the AXI data bus and the Interlaken core 534. The Interlaken core 534 provides a high-speed C2C interconnect following the Interlaken protocol. The SerDes circuit 536 serializes and deserializes digital data for high-speed C2C communication. In some applications, the SerDes circuit 536 may support PCI Express (PCIe), Compute Express Link (CXL) or other standards. Data, which may have been received from another chip via the SerDes circuit 536, may be provided from the AXI bridge 532 to mux 530. In some embodiments, the C2C interface may receive commands via APB MUX 522, which may control the operations of the AXI bridge 532, the Interlaken core 534, and/or the (SerDes) circuit 536.

In other examples, the C2C interface may include any other suitable high speed communication port capable of sending transactions to the controller 510 and receiving responses (e.g., data on read commands and acknowledgements on write commands).

In some embodiments, the JTAG interface and/or the RISC interface may be used to control or program other components of the system 500. For example, commands may be provided to the system register 538 from APB MUX 524 via an APB decoder 526 (e.g., commands to write values to the system register 538). In another example, the C2C interface may receive commands from the JTAG interface and/or RISC interface via APB MUX 522. Further, in some embodiments, data may be exchanged between the JTAG interface and the C2C interface via the AXI DeMUX 528. The various select signals (APB_MUX_SEL, AXI_MUX_SEL, AXI_DEMUX_SEL) for the APB MUX 520, 522, 524, AXI MUX 530, and/or AXI DeMUX 528 may be provided from another computing device (not shown) and/or one of the interfaces, such as the JTAG, RISC, and/or C2C interface.

In operation, a computing device and/or user may determine which interface will be used to communicate with the memory 502 via the controller 510 and PHY 504. When the JTAG interface is selected, data is provided from the JTAG daisy chain 512 to the JTAG AXI 514 to AXI DeMUX 528 to the AXI MUX 530 to the controller 510. Commands are provided from the JTAG daisy chain 512 to the JTAG APB 516 to the APB decoder 518 to the APB MUX 520 to the controller 510. In some embodiments, the commands may include commands to write operating parameters to a control and status register of controller 510 (not shown in FIG. 5, see FIG. 4, for example) and/or indicate an operating mode of the controller 510. The controller 510 may perform various operations based on the commands and data provided (e.g., cause data to be read to or written to the memory device 502). Data may be provided from the controller 510 to the JTAG daisy chain 512 through the same data path.

When the RISC interface is selected, data is provided from the RISC 540 to the AXI MUX 530 to the controller 510 and commands are provided from the RISC 540 to the APB MUX 520 to the controller 510. In some embodiments, the commands may include commands to write operating parameters to a control and status register of the controller 510 and/or indicate an operating mode of the controller 510. The controller 510 may perform various operations based on the commands and data provided (e.g., cause data to be read to or written to the memory device 502). Data may be provided from the controller 510 to the RISC 540 through the same data path.

When the C2C interface is selected, data is provided from the SerDes circuit 536 via the Interlaken core 534 and AXI bridge 532 to the AXI MUX 530 to the controller 510. In some embodiments, the commands may be provided with the data. In some embodiments, the commands may be provided directly via an APB. In some embodiments, the commands may include commands to write operating parameters to a control and status register of the controller 510 and/or indicate an operating mode of the controller 510. The controller 510 may perform various operations based on the commands and data provided (e.g., cause data to be read to or written to the memory device 502). Data may be provided from the controller 510 to the SerDes circuit 536 through the same data path.

By providing the different interfaces with different capabilities (e.g., different speeds, command sets, etc.), the memory 502 may be tested in multiple different use scenarios. Not only may the memory 502 be tested in different configurations, different systems may connect to the controller 510 based on system interface types, bandwidth requirements, and/or latency requirements. Further, different memory types may be tested by the system 500 due to inclusion of the multimodal controller 510 and PHY 504. Accordingly, system 500 may provide robust memory testing for multiple memory types.

Figure 6:
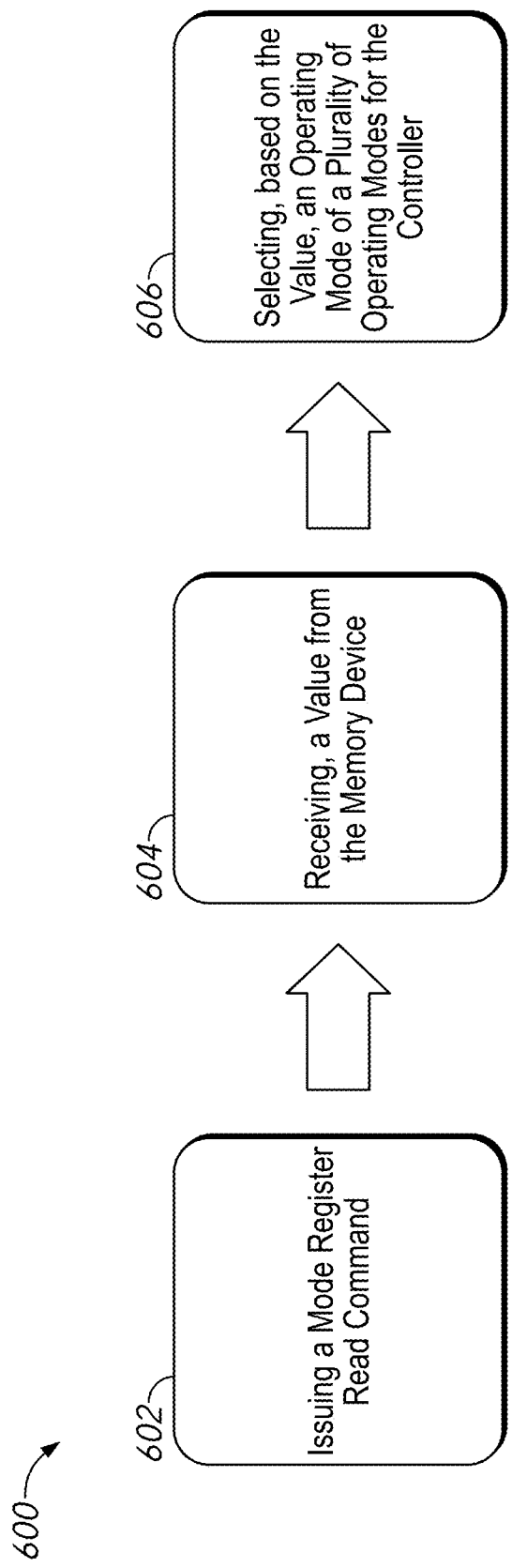
FIG. 6 is a flow chart of a method according to an embodiment of the disclosure.

FIG. 6 is a flow chart of a method according to an embodiment of the disclosure. In some embodiments, the method 600 may be performed in whole or in part by a controller, such as controller 10, 202, 302, 400, and/or 510.

At block 602, "issuing a mode register read command" may be performed. The mode register read command may be issued to a memory device, such as memory device 110, 200, 304, 406, and/or 502.

At block 604, "receiving, a value from the memory device" may be performed. The value may be received at the controller. In some embodiments, the value indicates a memory type of the memory device. For example, whether the memory is DRAM or an emerging memory type.

At block 606, "selecting, based on the value, an operating mode of a plurality of operating modes for the controller" may be performed. In some examples, the selecting includes selecting a value from a register of the controller. For example, a value for an operating parameter for the associated operating mode may be selected from a status and control register of the controller. In some examples, the value is one of multiple values stored in the register. In some examples, the other values may be associated with other ones of the multiple operating modes.

In some embodiments, method 600 may further include issuing a refresh command or issuing a wear leveling command from the controller based, at least in part, on the operating mode. For example, different memories use different techniques for data preservation. In some embodiments, method 600 may further include setting a timing parameter of the controller based, at least in part, on the operating mode. For example, some operating parameters indicate timing parameters used by the memory type.

Figure 7:
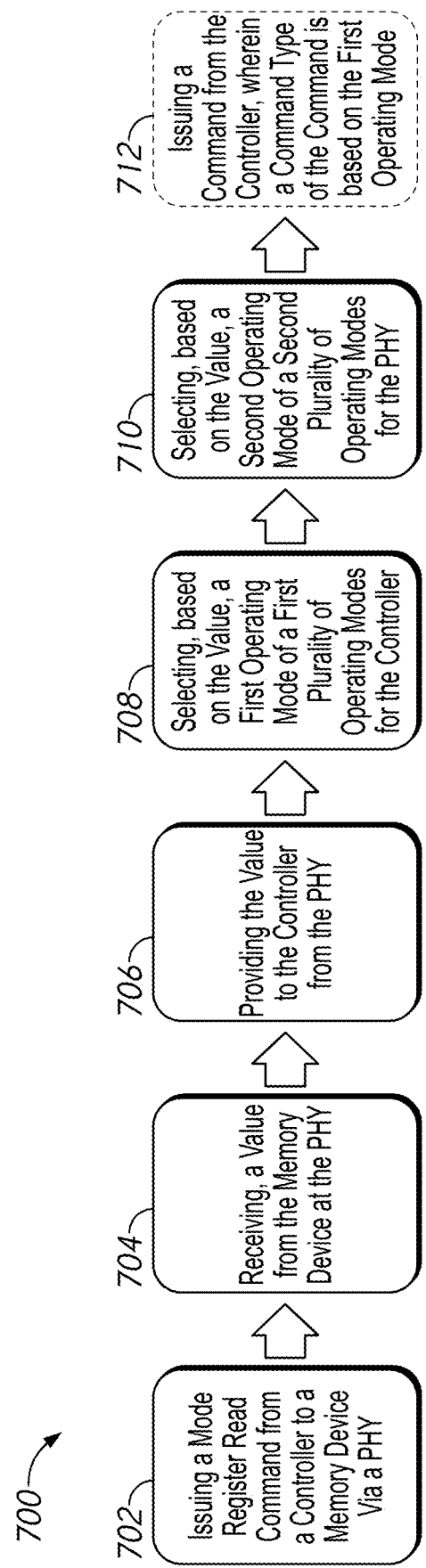
FIG. 7 is a flow chart of a method according to an embodiment of the disclosure.

FIG. 7 is a flow chart of a method according to an embodiment of the disclosure. In some embodiments, the method 700 may be performed in whole or in part by a controller and a PHY, such as controller 10, 202, 302, 400, and/or 510 and PHY 135, 204, 300, 404, and 504.

At block 702, "issuing a mode register read command from a controller to a memory device via a PHY" may be performed. In some embodiments, the memory device may include memory device 110, 200, 304, 406, and/or 502.

At block 704, "receiving, a value from the memory device at the PHY" may be performed. In some embodiments, the value indicates a memory type of multiple memory types of the memory device. At block 706, "providing the value to the controller from the PHY" may be performed.

At block 708, "selecting, based on the value, a first operating mode of a first plurality of operating modes for the controller" may be performed. At block 710, "selecting based on the value, a second operating mode of a second plurality of operating modes for the PHY" may be performed. In some embodiments, the first plurality of operating modes and the second plurality of operating modes include a timing parameter, a command type, or a combination thereof associated with the memory type of the memory device. In some embodiments, selecting the first operating mode includes selecting a second value from a first register of the controller and selecting the second operating mode comprises selecting a third value from a second register of the PHY.

Optionally, method 700 may include block 712 where, "issuing a command from the controller, wherein a command type of the command is based on the first operating mode" may be performed.

Optionally, when the controller controls the PHY, method 700 may further include "programming, with the controller, the third value of the second register of the PHY." In other embodiments, the PHY may be programmed by another device, such as a processor.

Figure 8:
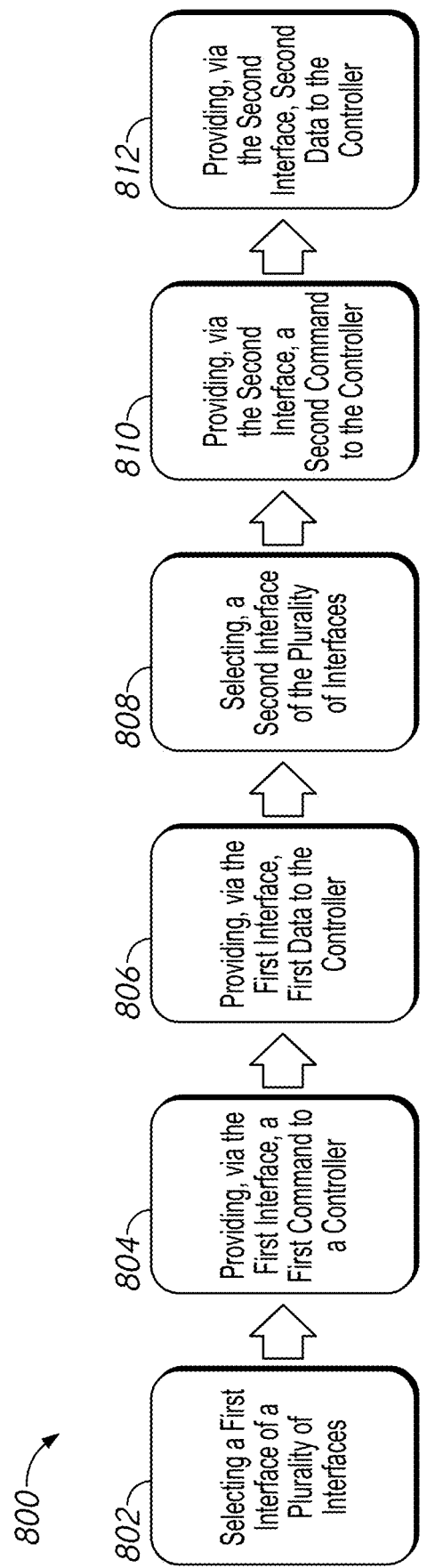
FIG. 8 is a flow chart of a method according to an embodiment of the disclosure.

FIG. 8 is a flow chart of a method according to an embodiment of the disclosure. In some embodiments, method 800 may be performed in whole or in part by a system such as system 500 shown in FIG. 5.

At block 802, "selecting a first interface of a plurality of interfaces" may be performed. In some embodiments, this may be performed by a component of the system, such as RISC 540 or an external device.

At block 804, "providing, via the first interface, a first command to a controller" may be performed. For example, a command may be provided to controller 510. At block 806, "providing, via the first interface, first data to the controller" may be performed. In some embodiments, the first command writes a value to a status and control register of the controller. In some embodiments, the value indicates an operating parameter for an operating mode of the controller. In some embodiments, the value indicates an operating mode of the controller.

At block 808, "selecting a second interface of the plurality of interfaces" may be performed. In some embodiments, method 800 further includes setting a state of a multiplexer signal to select the one of the plurality of interfaces. At block 810, "providing, via the second interface, a second command to the controller" may be performed. At block 812, "providing, via the second interface, second data to the controller" may be performed. In some embodiments, the first command, the second command, or a combination thereof, comprises a JEDEC command (e.g., LPDDR5 JEDEC command).

In some embodiments, the first interface or the second interface includes a Joint Test Action Group (JTAG) interface and the first command or the second command includes a write command and the first data or the second data comprises a pattern to be written to a memory device in communication with the controller. In some embodiments, the first interface or the second interface comprise a reduced instruction set computer (RISC) interface wherein the first command or the second command and the first data or the second data simulates a mobile device. In some embodiments, the first interface or the second interface comprises a SerDes circuit.

The memory controllers and PHYs disclosed herein may accommodate multiple memory types. In some embodiments, the memory controllers and PHYs disclosed herein may be included in multiple system types (e.g., mobile devices, servers, desktop computers) with different memory requirements. In some applications, this may allow more flexibility for product designers. In some embodiments, the memory controllers and PHY may be included in a system for testing multiple memory types. The apparatuses, systems, and methods disclosed herein may provide support for multiple memory types and/or more robust memory testing. In some applications, this may allow memory developers to advance farther in the design process prior to testing by controller developers and/or to provide more reliable memories for testing by controller developers. In some applications, this may reduce memory failures, redesigns, and/or total development time.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. A method comprising:
   storing in a mode register of a memory device, a value, wherein the value indicates a memory type of the memory device;
   receiving at the memory device from a controller, a mode register read command;
   responsive to the mode register read command, providing the value to the controller; and
   after providing the value, receiving a command from the controller, wherein the command is provided with a timing compatible with the memory type of the memory device.

2. The method of claim 1, wherein the command is a refresh command.

3. The method of claim 1, wherein the command is a wear leveling command.

4. The method of claim 1, wherein the memory type indicates a number of columns of an array of the memory device, a standard supported by the memory device, a memory technology of the memory device, or a combination thereof.

5. The method of claim 4, wherein the memory technology comprises dynamic random access memory (RAM), NAND memory, spin-transfer magnetoresistive RAM, ferroelectric memory, spin-orbital torque MRAM, phase change memory, or resistive RAM.

6. A method comprising:
   receiving at a physical interface layer (PHY) from a controller, a mode register read command;
   providing the mode register read command from the PHY to a memory device;
   receiving at the PHY a value from the memory device, wherein the value indicates a memory type of the memory device;
   providing the value to the controller from the PHY; and
   receiving at the PHY from the controller a selection of a second value stored in a register of the PHY, wherein the second value corresponds to an operating mode of the PHY.

7. The method of claim 6 further comprising:
   receiving at the PHY from the controller the second value; and
   storing the second value in the register.

8. The method of claim 6, wherein the operating mode includes a timing parameter, a command type, or a combination thereof associated with the memory type.

9. The method of claim 6, further comprising:
   receiving a command at the PHY from the controller, wherein the command type of the command is based, at least in part, on the value; and
   providing the command from the PHY to the memory device.

10. A system comprising:
a memory device comprising a mode register configured to store a value indicating a memory type of the memory device; and
a test system coupled to the memory device, the test system comprising:
- a physical interface (PHY) coupled to the memory device and configured to operate with a plurality of memory types, wherein the memory type of the memory device is included in the plurality of memory types, and the PHY is configured to receive the value from the memory device;
- a controller coupled to the PHY and configured to operate with the plurality of memory types; and
- a plurality of interfaces configured to provide data, commands, or a combination thereof, to the memory device via the controller and PHY.

11. The system of claim 10, wherein the memory device comprises a dynamic random access memory (RAM) device, a NAND memory device, a spin-transfer magnetoresistive RAM device, ferroelectric memory device, a spin-orbital torque MRAM device, a phase change memory device, or a resistive RAM device.

12. The system of claim 10, wherein the plurality of interfaces comprises a Joint Test Action Group (JTAG) interface, a reduced instruction set computer interface, and a chip-to-chip interface.

13. The system of claim 10, wherein the PHY comprises a hard PHY and a soft PHY.

14. The system of claim 13, wherein the soft PHY comprises a register.

15. A method comprising:
receiving at a memory device from a controller of a test system, a mode register read command, wherein the value indicates a memory type of the memory device;
responsive to the mode register read command, providing a value to the controller;
receiving, at the memory device from the controller, a first command, wherein the first command is a reduced instruction set computer (RISC) command;
executing, with the memory device, the first command;
receiving, at the memory device from the controller, a second command, wherein the second command is a JEDEC command; and
executing, with the memory device, the second command.

16. The method of claim 15, further comprising:
receiving, at the memory device from the controller, a data pattern; and
storing the data pattern in an array of the memory device.

17. The method of claim 16, wherein the data pattern is provided from a joint test action group interface of the test system.

18. The method of claim 15, wherein the first command is provided from a RISC interface of the test system.

19. The method of claim 15, wherein the JEDEC command is received from a chip-to-chip interface of the test system.

* * * * *